United States Patent
Otsubo et al.

(10) Patent No.: US 10,559,535 B2
(45) Date of Patent: Feb. 11, 2020

(54) HIGH-FREQUENCY MODULE AND MANUFACTURING METHOD THEREFOR

(71) Applicant: Murata Manufacturing Co., Ltd., Kyoto (JP)

(72) Inventors: Yoshihito Otsubo, Kyoto (JP); Yoshihisa Masuda, Kyoto (JP); Hideo Nakagoshi, Kyoto (JP); Yuta Morimoto, Kyoto (JP); Norio Sakai, Kyoto (JP); Yoriyuki Matsumoto, Kyoto (JP); Hiroaki Tsuchida, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/892,504

(22) Filed: Feb. 9, 2018

(65) Prior Publication Data

US 2018/0166394 A1    Jun. 14, 2018

Related U.S. Application Data

(63) Continuation of application No. PCT/JP2016/073235, filed on Aug. 8, 2016.

(30) Foreign Application Priority Data

Aug. 11, 2015 (JP) ................. 2015-158725

(51) Int. Cl.
*H01L 23/31* (2006.01)
*H01L 23/552* (2006.01)
*H01L 21/48* (2006.01)
*H01L 21/56* (2006.01)
(Continued)

(52) U.S. Cl.
CPC ........ *H01L 23/552* (2013.01); *H01L 21/4853* (2013.01); *H01L 21/4857* (2013.01);
(Continued)

(58) Field of Classification Search
CPC ... H01L 23/28; H01L 21/4853; H01L 23/552; H01L 23/5386; H01L 23/5383;
(Continued)

(56) References Cited

U.S. PATENT DOCUMENTS

2008/0045063 A1    2/2008  Bauer et al.
2008/0210462 A1*   9/2008  Kawagishi ............ H01L 21/561
                                                      174/377
(Continued)

FOREIGN PATENT DOCUMENTS

CN    101958254        1/2011
CN    104064528 A      9/2014
(Continued)

OTHER PUBLICATIONS

International Search Report for International Application No. PCT/JP2016/073235 dated Oct. 11, 2016.
(Continued)

*Primary Examiner* — Ahmed N Sefer
(74) *Attorney, Agent, or Firm* — Pearne & Gordon LLP

(57) ABSTRACT

The present disclosure improves the adhesive strength of a shield film in a high-frequency module that includes a shield film that shields components from unwanted electromagnetic waves from the outside. A high-frequency module is provided with: a sealing body that includes a multilayer wiring substrate, components that are mounted on an upper surface of the multilayer wiring substrate, and a sealing resin layer that is stacked on the upper surface of the multilayer wiring substrate and covers the components; and a shield film that covers a surface of the sealing resin layer. A side surface of the sealing body has curved surface portions formed so as to have a curved surface shape, and the curved surface portions are roughened with a plurality of grooves.

8 Claims, 7 Drawing Sheets

(51) Int. Cl.
*H01L 21/78* (2006.01)
*H01L 23/13* (2006.01)
*H01L 23/538* (2006.01)
*H01L 23/66* (2006.01)

(52) U.S. Cl.
CPC ............ *H01L 21/565* (2013.01); *H01L 21/78* (2013.01); *H01L 23/13* (2013.01); *H01L 23/3114* (2013.01); *H01L 23/5383* (2013.01); *H01L 23/5386* (2013.01); *H01L 23/66* (2013.01)

(58) Field of Classification Search
CPC ......... H01L 23/66; H01L 23/13; H01L 21/78; H01L 21/565; H01L 21/4857; H01L 23/3114; H01L 23/3121
See application file for complete search history.

(56) References Cited

U.S. PATENT DOCUMENTS

| | | |
|---|---|---|
| 2011/0006408 A1 | 1/2011 | Liao |
| 2012/0223622 A1* | 9/2012 | Otsuki ..................... H03H 9/02 310/344 |
| 2014/0284775 A1 | 9/2014 | Nomura |
| 2015/0043171 A1* | 2/2015 | Mugiya ................. H01L 23/552 361/728 |
| 2015/0171020 A1* | 6/2015 | Shibuya ................ H01L 23/552 257/659 |
| 2016/0351525 A1* | 12/2016 | Chun ................. H01L 23/49811 |
| 2018/0114759 A1* | 4/2018 | Orikasa ................. H01L 23/552 |

FOREIGN PATENT DOCUMENTS

| | | |
|---|---|---|
| JP | 2000-311841 A | 11/2000 |
| JP | 2007-243122 A | 9/2007 |
| JP | 2014-209544 A | 11/2014 |

OTHER PUBLICATIONS

Written Opinion for International Application No. PCT/JP2016/073235 dated Oct. 11, 2016.

* cited by examiner

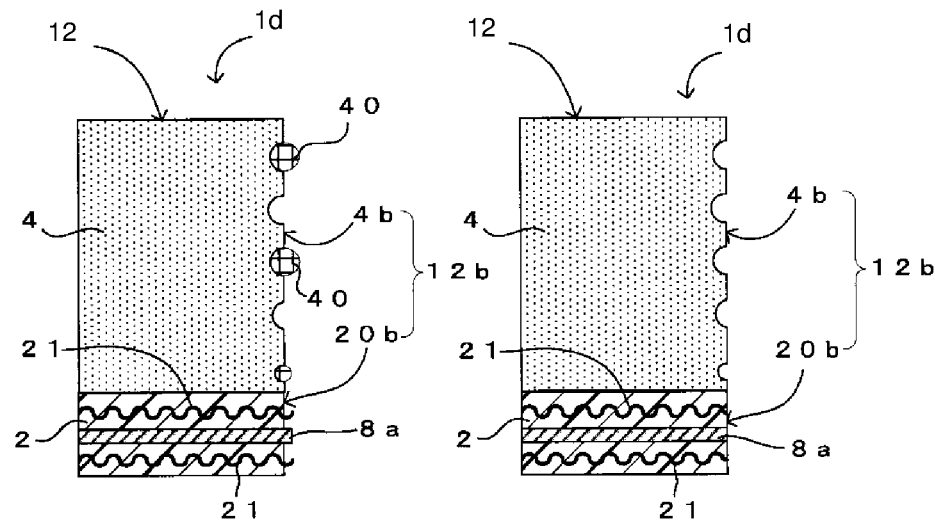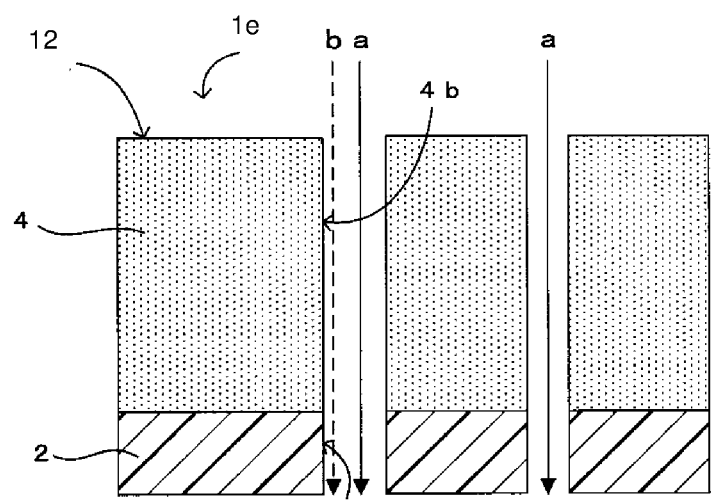

HIGH-FREQUENCY MODULE AND MANUFACTURING METHOD THEREFOR

This is a continuation of International Application No. PCT/JP2016/073235, filed on Aug. 8, 2016 which claims priority from Japanese Patent Application No. 2015-158725 filed on Aug. 11, 2015. The contents of these applications are incorporated herein by reference in their entireties.

BACKGROUND

Technical Field

The present disclosure relates to a high-frequency module that includes a sealing resin layer that covers a plurality of components mounted on a wiring substrate, and a shield film that shields the components from unwanted electromagnetic waves from the outside. The present disclosure also relates to a method of manufacturing the high-frequency module.

A high-frequency module mounted in a mobile terminal device or the like may be provided with a shield layer that is for blocking electromagnetic waves. Among such high-frequency modules, there is a high-frequency module in which components mounted on a wiring substrate are covered with a molded resin and a shield layer is provided so as to cover the surface of the molding resin.

For example, as illustrated in FIG. 15, a high-frequency module 100 disclosed in Patent Document 1 includes a resin substrate 101, and a shield layer 102 that is stacked on an upper surface of the resin substrate 101. In this case, since a metal film has low adhesive strength on resin, the shield layer 102 is formed to have a three-layer structure consisting of an adhesive film 102a that is formed on the resin substrate 101, a conductive film 102b that is formed on the adhesive film 102a, and a protective film 102c that is formed on the conductive film 102b. Specifically, the conductive film 102b is formed using any out of Cu, Ag, and Al. In addition, the adhesive film 102a is formed of stainless steel, which has a higher adhesive strength with the resin substrate 101 than the conductive film 102b. Furthermore, the protective film 102c formed on the conductive film 102b is formed of stainless steel, which has higher corrosion resistance than the conductive film 102b. By forming the shield layer 102 so as to have a three-layer structure in this way, adhesive strength, corrosion resistance, and so forth are improved.

Patent Document 1: Japanese Unexamined Patent Application Publication No. 2007-243122 (refer to paragraphs 0019-0026 and FIG. 1, and so on)

BRIEF SUMMARY

Further improvement of the adhesion between the resin substrate 101 and the shield layer 102 is demanded. For example, this type of high-frequency module is often formed so as to have a rectangular shape in plan view, and the side surfaces of the high-frequency module are formed so as to be flat in such a case, but there are high-frequency modules in which parts of the side surfaces are formed so as to have curved surface shapes depending on the electronic appliance in which the high-frequency modules are to be mounted. In such a case, the high-frequency modules are first formed so as to have a rectangular shape in plan view by performing cutting using a dicing machine, and then the side surfaces are formed so as to have curved surface shapes using laser processing, and the side surfaces are typically entirely formed using laser processing. However, when a laser is used to process a high-frequency module, there is a problem in that it is more difficult to attach a shield layer to curved surface portions of the side surface of the high-frequency module than to the other parts. In addition, in a configuration in which an end portion of an inner wiring electrode is exposed at a side surface of a wiring substrate, there is a problem in that it is also difficult to attach a shield layer to this exposed part. These problems arise not only in the case where a shield layer is formed of a sputtered film or a vapor-deposited film, but also in the case where the shield layer is formed of a conductive paste.

The present disclosure improves the adhesive strength of a shield film in a high-frequency module that includes a shield film that shields components from unwanted electromagnetic waves from the outside.

A high-frequency module of the present disclosure includes: a sealing body that includes a wiring substrate, a component that is mounted on a main surface of the wiring substrate, and a sealing resin layer that is stacked on the main surface of the wiring substrate and covers the component; and a shield film that covers a surface of the sealing resin layer. A side surface of the sealing body has a curved surface portion that is formed in a curved surface shape or a substantially curved surface shape, and the curved surface portion is subjected to roughening.

With this configuration, the curved surface portion of the sealing body is subjected to roughening, and therefore the adhesive strength of the shield film on the curved surface portion, which originally had a low adhesive strength, can be improved.

In addition, a plurality of grooves that extends in a direction that intersects the main surface of the wiring substrate may be provided in the curved surface portion, and the curved surface portion may be roughened by the plurality of grooves. In this case, the curved surface portion can be easily roughened when the curved surface portion of the sealing body is formed by laser processing, for example.

In addition, the high-frequency module may further include a ground electrode that is provided in or on the wiring substrate, and an end portion of the ground electrode may be exposed at the curved surface portion. With this configuration, the connection between the ground electrode and the shield film is ensured, and the characteristics of the shield film can be improved.

In addition, a high-frequency module of the present disclosure may include: a sealing body that includes a wiring substrate that is provided with a ground electrode, a component that is mounted on a main surface of the wiring substrate, and a sealing resin layer that is stacked on the main surface of the wiring substrate and covers the component; and a shield film that covers a surface of the sealing resin layer. An exposed part of an end portion of the ground electrode may be formed at a side surface of the sealing body, and a prescribed region of the side surface of the sealing body, the prescribed region containing the exposed part of the end portion of the ground electrode, may be subjected to roughening. With this configuration, the connection between the shield film and the ground electrode is ensured by improving the adhesive strength of the shield film in the prescribed region of the side surface of the sealing body, and as a result, the characteristics of the shield film are improved.

In addition, a plurality of grooves that extends in a direction that intersects the main surface of the wiring substrate may be provided in the prescribed region, and the prescribed region may be roughened by the plurality of grooves. In this case, the curved surface portion can be easily roughened when the curved surface portion of the sealing body is formed by laser processing, for example.

A plurality of grooves that extends in a direction that intersects the main surface of the wiring substrate may be provided in another region of the side surface of the sealing body that is different from the prescribed region, and thereby the other region may also roughened, and the grooves provided in the prescribed region may be formed so as to have a smaller width than the grooves provided in the other region, and as a result the prescribed region may have a larger number of grooves per unit area than the other region.

In this case, not only the prescribed region, but also the other region is roughened, and therefore the adhesive strength of the shield film on the side surface of the sealing body can be further improved. In addition, since the grooves are formed such that the number of grooves per unit area in the prescribed region is greater than the number of grooves per unit area in the other region, the unevenness created by the grooves in the prescribed area is finer. In this way, the adhesive strength of the shield film is increased in the prescribed region in which the ground electrode is exposed, and therefore the characteristics of the shield film can be improved while improving the adhesive strength of the shield film over the entirety of the side surface of the sealing body.

In addition, a high-frequency module manufacturing method of the present disclosure includes: a preparation step of preparing an assembly in which a plurality of sealing bodies is arrayed in a matrix pattern, each sealing body including a wiring substrate, a component that is mounted on a main surface of the wiring substrate, and a sealing resin layer that is stacked on the main surface of the wiring substrate and covers the component; a first laser processing step of forming a curved surface portion on part of a side surface of each sealing body by hollowing out part of the assembly using laser processing; a second laser processing step of irradiating the curved surface portions of the sealing bodies with laser light of a lower energy than used in the first laser processing step; a dividing step of dividing the assembly into individual sealing bodies by cutting the assembly with a dicing machine or with laser processing; and a shield film forming step of forming shield films that cover surfaces of the sealing resin layers of the sealing bodies. In the first laser processing step, the curved surface portions of the sealing bodies are roughened by being scanned with laser light.

In this method, a curved surface portion of a sealing body is roughened in the first laser processing step, and therefore the adhesive strength of a shield film can be improved in a high-frequency module having a curved surface portion on a side surface of the sealing body. Furthermore, in the second laser processing step, the curved surface portion of the sealing body is irradiated with laser light of a lower energy than that used in the first laser processing step, and therefore a thermally modified layer that is formed in the curved surface portion during the laser processing can be made thinner. In addition, since part of the assembly is hollowed out when forming the curved surface portion of each sealing body in the first laser processing step, cutting waste of the second laser processing step can be prevented from adhering to the curved surface portion of the sealing body. Therefore, there is no need to provide a step of cleaning away cutting waste that is adhered to the curved surface portions after the second laser processing step. In addition, the parts of the assembly that are hollowed out during the first laser processing step are not generated as cut pieces during the dividing step. Therefore, the products produced by dividing the assembly into individual sealing bodies are easier to handle, and problems caused by infiltration of cut pieces can be prevented. In addition, visual inspection of the curved surface portions of the sealing bodies obtained after the laser processing step can be easily performed.

According to the present disclosure, the adhesive strength of a shield film can be improved in cases such as where a curved surface portion of a sealing body is roughened or a ground electrode is exposed at a side surface.

BRIEF DESCRIPTION OF THE SEVERAL VIEWS OF THE DRAWINGS

FIGS. 12A and 12B are diagrams for explaining the state of a cut sectional surface formed by laser processing.

FIG. 13 is an explanatory diagram for a high-frequency module according to a fifth embodiment of the present disclosure.

DETAILED DESCRIPTION

First Embodiment

Figure 1:
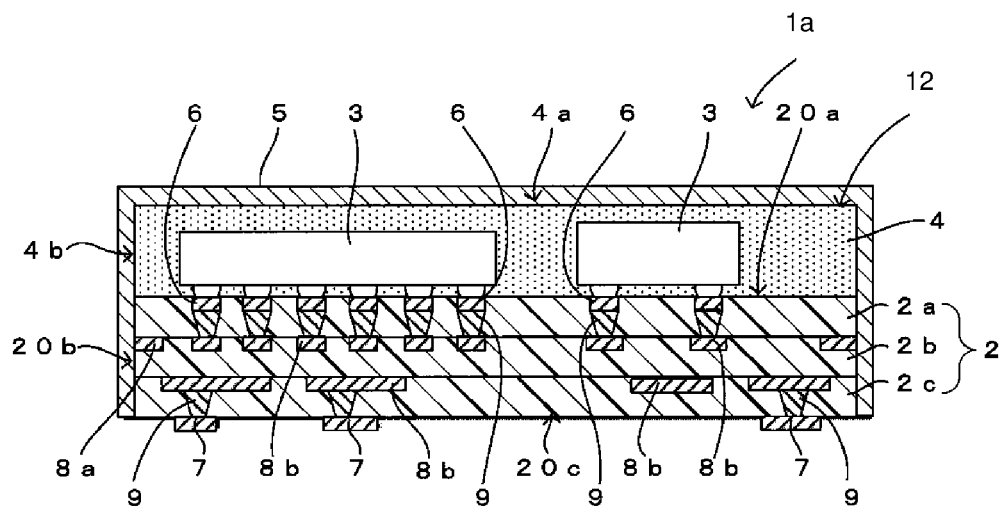
FIG. 1 is a sectional view of a high-frequency module according to a first embodiment of the present disclosure.
Figure 2:
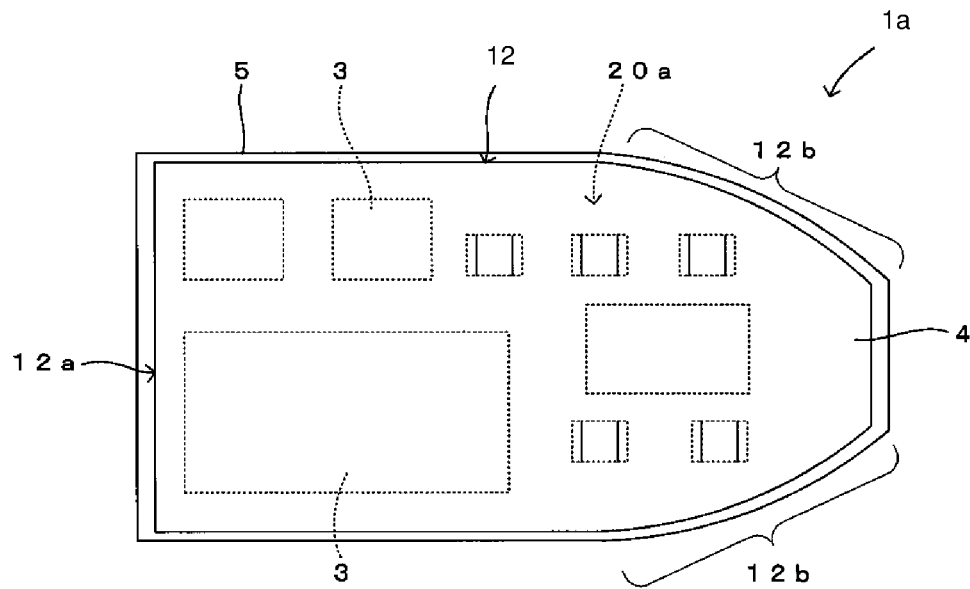
FIG. 2 is a plan view of the high-frequency module in FIG. 1.
Figure 3:
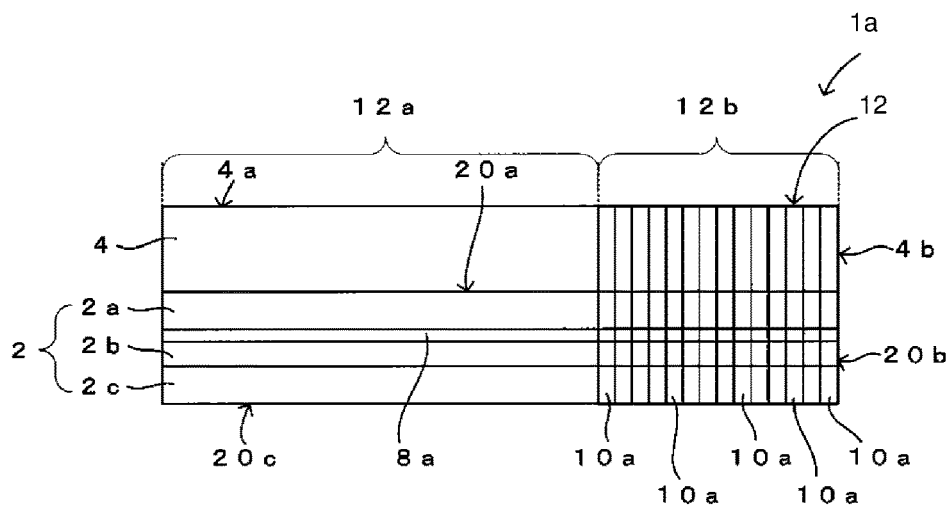
FIG. 3 is a side view of the high-frequency module in FIG. 1.
Figure 4:
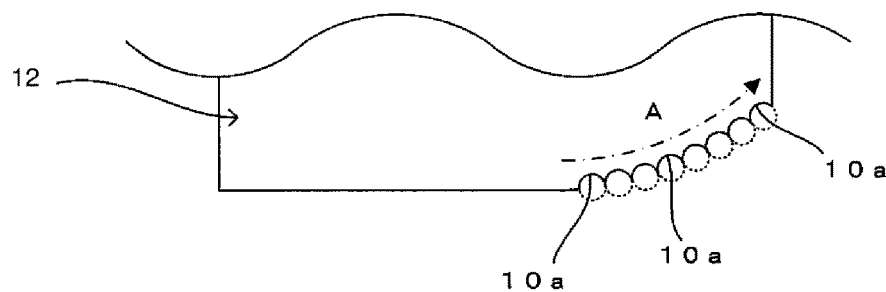
FIG. 4 is a diagram illustrating grooves provided in a side surface of the high-frequency module in FIG. 1.

A high-frequency module according to a first embodiment of the present disclosure will be described while referring to FIGS. 1 to 4. FIG. 1 is a sectional view of a high-frequency module, FIG. 2 is a plan view of the high-frequency module, FIG. 3 is a side view of a high-frequency module, and FIG. 4 is a diagram illustrating grooves provided in a side surface of the high-frequency module. In addition, in FIG. 2, illustration of part of a shield film that covers an upper surface of a sealing resin layer is omitted. In FIG. 3, illustration of the shield film is omitted.

As illustrated in FIGS. 1 and 2, a high-frequency module 1a according to this embodiment includes a multilayer wiring substrate 2 (corresponding to a "wiring substrate" of the present disclosure), a plurality of components 3 that is mounted on an upper surface 20a of the multilayer wiring substrate 2, a sealing resin layer 4 that is stacked on the upper surface 20a of the multilayer wiring substrate 2, and a shield film 5 that covers the surface of the sealing resin layer 4. The high-frequency module 1a is mounted on a motherboard or the like of an electronic appliance in which high-frequency signals are used, for example.

The multilayer wiring substrate 2 is obtained by stacking on top of one another a plurality of insulating layers 2a to 2c, which is formed of a low-temperature co-firing ceramic or a glass epoxy resin for example. Mounting electrodes 6, which are used to mount the components 3, are formed on the upper surface 20a of the multilayer wiring substrate 2 (corresponds to "a main surface of the wiring substrate" of the present disclosure), and a plurality of external-connection-use outer electrodes 7 is formed on a lower surface 20c of the multilayer wiring substrate 2. In addition, various inner wiring electrodes 8a and 8b are arranged between the adjacent insulating layers 2a to 2c, and a plurality of via conductors 9, which are for realizing interlayer connections between the inner wiring electrodes 8a and 8b, are formed inside the multilayer wiring substrate.

The mounting electrodes 6, the outer electrodes 7, and the inner wiring electrodes 8a and 8b are formed of a metal typically employed for wiring electrodes such as Cu, Ag, or Al. In addition, the via conductors 9 are formed of a metal, such as Ag or Cu. Nickel and gold plating may be performed on the mounting electrodes 6 and the outer electrodes 7.

The components 3 are each formed of semiconductor element formed of a semiconductor such as Si or GaAs, or a chip component such as a chip inductor, a chip capacitor, or a chip resistor.

The sealing resin layer 4 is stacked on the multilayer wiring substrate 2 so as to cover the upper surface 20a of the wiring substrate 2 and the components 3. The sealing resin layer 4 can be formed of a resin that is typically employed as a sealing resin such as an epoxy resin. In addition, a sealing body 12 is formed by the part of high-frequency module 1a that is constituted by the multilayer wiring substrate 2, the sealing resin layer 4, and the components 3.

Furthermore, as illustrated in FIG. 2, a side surface of the sealing body 12 (side surface 20b of multilayer wiring substrate 2 and side surface 4b of sealing resin layer 4) has both a flat surface portion 12a that is formed so as to have a flat surface shape, and curved surface portions 12b that are formed so as to have curved surface shapes. The curved surface portions 12b can be formed by first forming an assembly of a plurality of sealing bodies 12 arranged in a matrix pattern, and then cutting the assembly into individual sealing bodies 12 having a rectangular shape in plan view using a dicing machine and performing chamfering on two corners of each sealing body 12 to form curved surface shapes using laser processing. The dividing of the assembly into individual sealing bodies 12 may be alternatively performed using only laser processing. In addition, rather than being formed so as to have a perfectly curved surface shape, the curved surface portions 12b may alternatively be formed so as to have substantially curved surface shapes by forming the curved surface portions 12b so as to have polygonal shapes in plan view. In addition, the order in which the cutting using a dicing machine and the laser processing is performed may be reversed.

Furthermore, in this embodiment, the inner wiring electrode 8a is provided as a grounding-use ground electrode, and an end portion of the inner wiring electrode 8a is exposed at the side surface 20b of the multilayer wiring substrate 2 (refer to FIG. 3). In this case, the end portion of the inner wiring electrode 8a is exposed at both the flat surface portion 12a and the curved surface portions 12b of the side surface of the sealing body 12. The manner in which the inner wiring electrode 8a is exposed at the side surface of the sealing body 12 may be changed, as appropriate.

The shield film 5 is for shielding the various wiring electrodes 8a and 8b inside the multilayer wiring substrate 2 and the components 3 from noise from the outside, and is stacked on the sealing resin layer 4 so as to cover an upper surface 4a of the sealing resin layer 4 (surface on opposite side from upper surface 20a of multilayer wiring substrate 2), the side surface 4b that extends in a downward direction relative to the upper surface 4a, and the side surface 20b of the multilayer wiring substrate 2. The shield film 5 is connected to the inner wiring electrode 8a, which is exposed at the side surface 20b of the multilayer wiring substrate 2.

Furthermore, the shield film 5 can be formed so as to have a multilayer structure consisting of an adhesive film that is stacked on the surface of the sealing resin layer 4, a conductive film that is stacked on the adhesive film, and a protective film that is stacked on the conductive film.

The adhesive film is provided in order to increase the adhesive strength between the conductive film and the sealing resin layer 4, and can be formed of any metal from among SUS, Ti, Cr, Ni, and TiAl, for example. The conductive film is the layer that substantially realizes the shielding function of the shield film 5, and can be formed of any metal from among Cu, Ag, and Al, for example. The protective film is provided in order to prevent corrosion of and damage to the conductive film, and can be formed of any metal from among SUS, Ti, Cr, Ni, and TiAl, for example.

When laser processing is used to divide the assembly into individual sealing bodies 12 and when an end portion of the inner wiring electrode 8a is exposed at the side surface of such a laser-processed part, there is a problem in that the adhesive strength of the shield film 5 at such parts is reduced. This is thought to be mainly due to carbides and oxides that are generated when the laser cutting is performed. Accordingly, in this embodiment, the curved surface portions 12b of the sealing body 12 are roughened, and as a result the contact surface areas between the curved surface portions 12b and the shield film 5 are increased and the adhesive strength between the curved surface portions 12b of the sealing body 12 and the shield film 5 is improved. Specifically, as illustrated in FIG. 3, a plurality of grooves 10a that extends in a direction that intersects (in this embodiment, perpendicularly intersects) the upper surface 20a or the lower surface 20c of the wiring substrate 2 are formed in the curved surface portions 12b of the side surface of the sealing body 12, and fine unevenness is provided on the curved surface portions 12b by these grooves 10a. In addition, in this embodiment, the grooves 10a are arrayed in a substantially continuous manner within the curved surface portions.

The grooves 10a are formed by adjusting the laser processing conditions. For example, in the case where ultraviolet light (wavelength 200-400 nm) is used as laser light, conditions of laser pulses of around 50 kHz and a scanning speed of around 1750 mm/s are adopted. As a result, as illustrated in FIG. 4, grooves 10a, which have a substantially semicircular shape in a plan view of the multilayer wiring substrate 2, can be arrayed in a continuous manner in a laser scanning direction (arrow A). The flat surface portion 12a part of the side surface of the sealing body 12 can also be formed using laser processing. In this case, for example, the pulse interval may be made narrower than in the case of the curved surface portions 12b by adopting conditions of laser pulses of 100 kHz and a scanning speed of 2000 mm/s. With these conditions, the side surface can be formed so that there are no grooves in the flat surface portion 12a (substantially flat surface shape). In this case, the curved surface portions 12b of the side surface of the sealing body 12 are formed such that any of an average roughness Ra, a maximum height Ry, and a ten point average roughness Rz of the curved surface portions 12b in the laser scanning direction (arrow A) are larger than the surface roughness of the flat surface portion 12a. The flat surface portion 12a may also be roughened by forming a plurality of grooves in the flat surface portion 12a as well. Provided that the pulse interval is for example at least 0.5 times the spot diameter (diameter of radiated laser), the side surface of the sealing body 12 can be roughened. When the sealing body 12 is irradiated with the laser, the diameter of the hole that is actually formed in the sealing body 12 by the heat from the laser irradiation tends to be larger than the spot diameter. Taking this into account, the magnitude of the unevenness that is formed in the side surface of the sealing body 12 can be made sufficiently large when the laser spot diameter (diameter of radiated laser) is made greater than or equal to the pulse interval. On the other hand, if the pulse interval is made too large, the regions between adjacent holes will not be cut and cutting cannot be realized, and therefore, the pulse interval may be less than or equal to 1.5 times the spot diameter, for example.

(Method of Manufacturing High-Frequency Module)

Next, an example of a method of manufacturing the high-frequency module 1a is described in which an assembly of a plurality of sealing bodies 12 is formed in which a plurality of high-frequency modules 1a is arrayed in a matrix pattern, and then the assembly is divided into individual sealing bodies 12. First, the multilayer wiring substrate 2, which has the mounting electrodes 6, the outer electrodes 7, the inner wiring electrodes 8a and 8b, and the via conductors 9 formed therein and thereon, is prepared.

Next, the components 3 are mounted on the upper surface 20a of the multilayer wiring substrate 2 using a known surface mount technique such as solder mounting or the like.

After that, the assembly of sealing bodies 12 is completed by stacking the sealing resin layer 4 on the upper surface 20a of the multilayer wiring substrate 2 so as to cover the components 3. The sealing resin layer 4 can be formed using a coating method, a printing method, a transfer molding method, a compression molding method, or the like.

Next, the surface of the sealing resin layer 4 is subjected to polishing or grinding in order to make the upper surface 4a of the sealing resin layer 4 flat.

After that, the assembly is divided into individual sealing bodies 12 by performing cutting using a dicing machine. At this time, each sealing body 12 is formed so as to have a rectangular shape in plan view.

Next, the curved surface portions 12b are formed on the side surface of each sealing body 12 (side surfaces 20b and 4b of multilayer wiring substrate 2 and sealing resin layer 4) through laser processing. At this time, laser light is scanned so as to chamfer two corner portions of each sealing body 12 (refer to arrow A in FIG. 4 for scanning direction), and a plurality of grooves 10a is formed in the curved surface portions 12b by adjusting the laser irradiation conditions. The dividing of the assembly into individual sealing bodies 12 and the shaping of the curved surface portions 12b may alternatively be performed using just laser processing.

Next, the shield films 5 are deposited so as to cover the surfaces of the sealing resin layers 4 (upper surfaces 4a and side surfaces 4b) and the side surfaces 20b of the multilayer wiring substrates 2 using a sputtering device or a vacuum vapor deposition device, and the high-frequency modules 1a are thus completed.

Therefore, according to the above-described embodiment, the curved surface portions 12b of the side surface of the sealing body 12 are roughened, and as a result, the adhesive strength of the shield film 5 at the curved surface portions 12b of the sealing body 12, which originally had low adhesive strength, can be improved. In addition, by forming the shield film 5 using a sputtering method or a vapor deposition method, the adhesive strength of the shield film 5 can be improved compared with that in the case of a method using a conductive paste such as a spin coating method.

Furthermore, the roughening of the curved surface portions 12b (forming of grooves 10a) can be performed by adjusting the laser processing conditions used when forming the sealing bodies 12, and therefore a reduction in the manufacturing cost of the high-frequency module 1a can be achieved.

In addition, since the connection between the end portion of the inner wiring electrode 8a (ground electrode), which is exposed at the curved surface portions 12b, and the shield film 5 is ensured by improving the adhesive strength of the shield film 5 on the curved surface portions 12b of the sealing body 12, the characteristics of the shield film 5 can be improved.

(Modification of High-Frequency Module)

Figure 5:
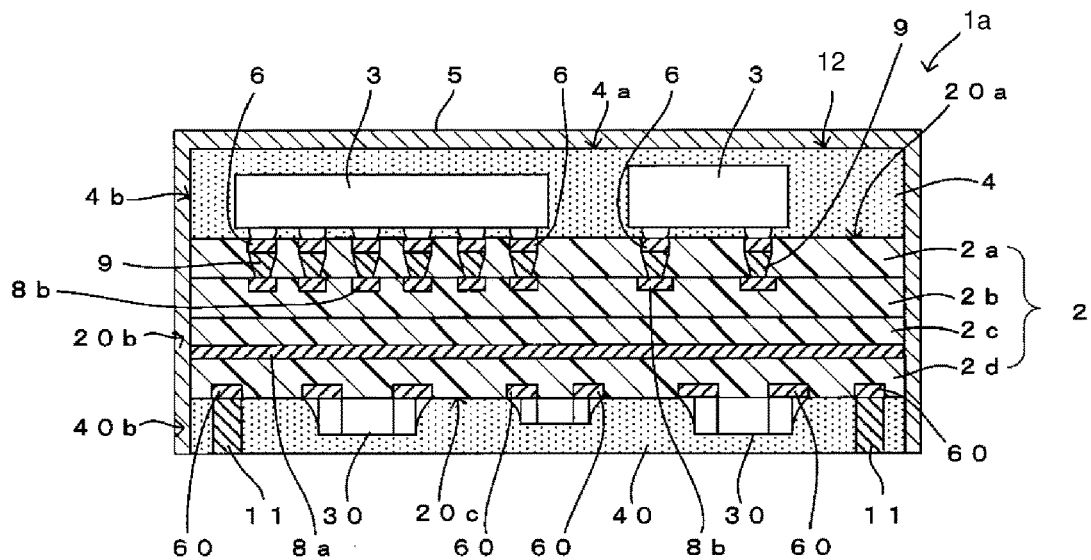
FIG. 5 is a diagram illustrating a modification of the high-frequency module in FIG. 1.

For example, as illustrated in FIG. 5, components 30 may also be mounted on the lower surface 20c of the multilayer wiring substrate 2. In this case, the multilayer wiring substrate 2 is formed of four insulating layers 2a to 2d, and the inner wiring electrode 8a (ground electrode) is arranged between the third insulating layer 2c from the top and the lowermost insulating layer 2d. This inner wiring electrode 8a is formed so as to have substantially the same surface area as the multilayer wiring substrate 2 in plan view, and also functions as a shield between the components 3 and 30 that are above and below the inner wiring electrode 8a. In addition, a sealing resin layer 40 that seals the components 30 is provided on the lower surface 20c side of the multilayer wiring substrate 2, and external-connection-use columnar conductors 11 are provided in the sealing resin layer 40. In this case, mounting electrodes 60, which are for mounting the components 30 and the columnar conductors 11, are formed on the lower surface 20c of the multilayer wiring substrate 2 instead of the outer electrodes 7. The shield film 5 additionally covers a side surface 40b of the sealing resin layer 40 on the lower surface 20c side.

With this configuration, high-density mounting of components 3 and 30 is facilitated while improving the adhesive strength of the shield film 5 on the curved surface portions 12b of the sealing body 12.

Second Embodiment

Figure 6:
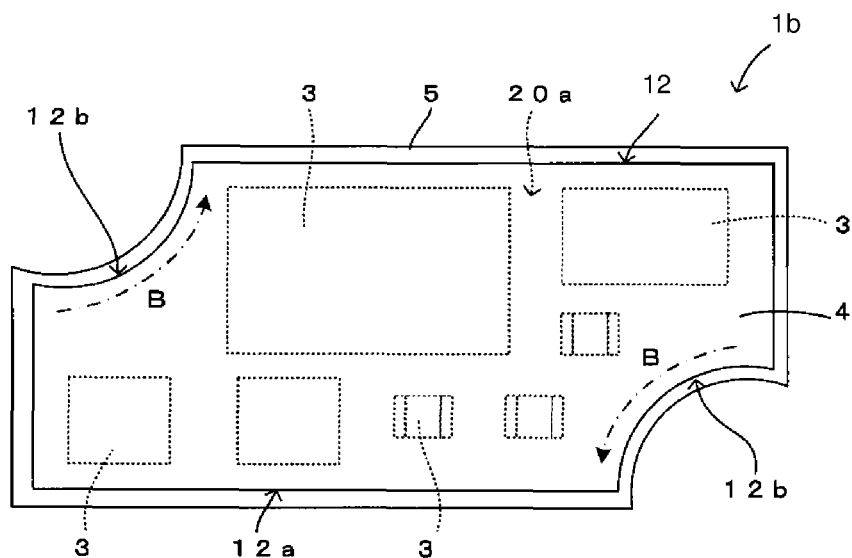
FIG. 6 is a plan view of a high-frequency module according to a second embodiment of the present disclosure.

A high-frequency module 1b according to a second embodiment of the present disclosure will be described while referring to FIG. 6. FIG. 6 is a plan view of the high-frequency module 1b in which illustration of a top surface part of the shield film 5 is omitted.

The high-frequency module 1b according to this embodiment differs from the high-frequency module 1a of the first embodiment described while referring to FIGS. 1 to 3 in that the shape of the sealing body 12 in plan view is different and the arrangement configuration of the components 3 is different, as illustrated in FIG. 6. The rest of the configuration is the same as that of the high-frequency module 1a of the first embodiment and therefore the same symbols are used and description thereof is omitted.

In this case, as illustrated in FIG. 6, a side surface of the sealing body 12 has curved surface portions 12b that are recessed toward the inside of the multilayer wiring substrate 2 at two diagonally located corners among the four corners of the rectangular shape thereof in a plan view of the multilayer wiring substrate 2. These curved surface portions 12b can be formed by scanning laser light in the directions indicated by arrows B. In addition, a plurality of grooves 10a (not illustrated in FIG. 6) similar to those in the high-frequency module 1a of the first embodiment is formed in the curved surface portions 12b by adjusting the laser irradiation conditions.

With this configuration, the similar effect as in the high-frequency module 1a of the first embodiment can be obtained in a configuration in which the side surface of the sealing body 12 has curved surface portions 12b that are recessed toward the inside of the multilayer wiring substrate 2.

Third Embodiment

Figure 7:
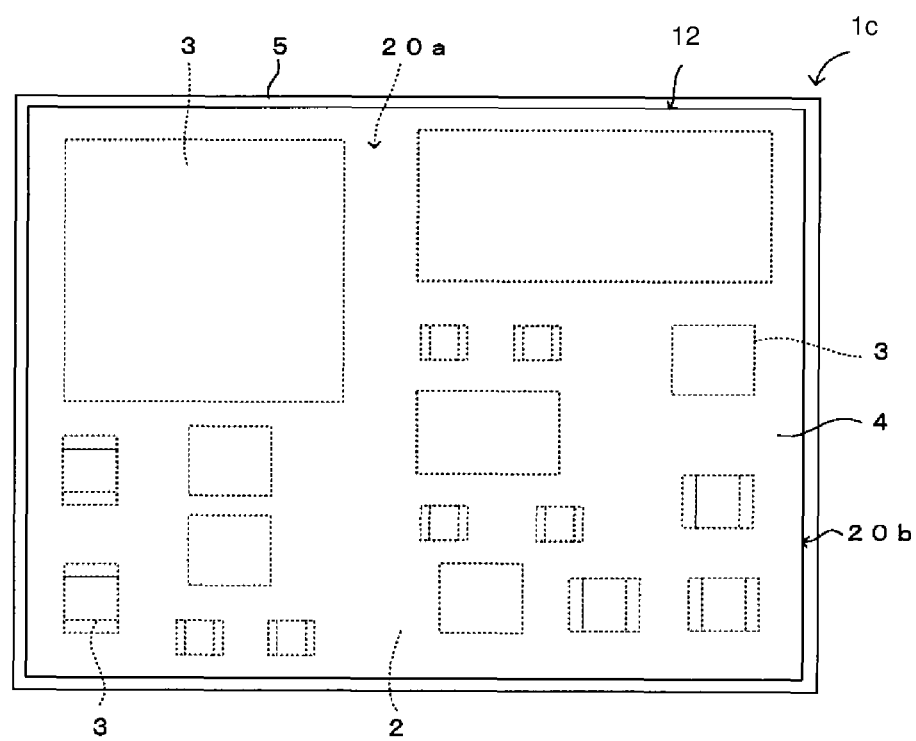
FIG. 7 is a plan view of a high-frequency module according to a third embodiment of the present disclosure.
Figure 8:
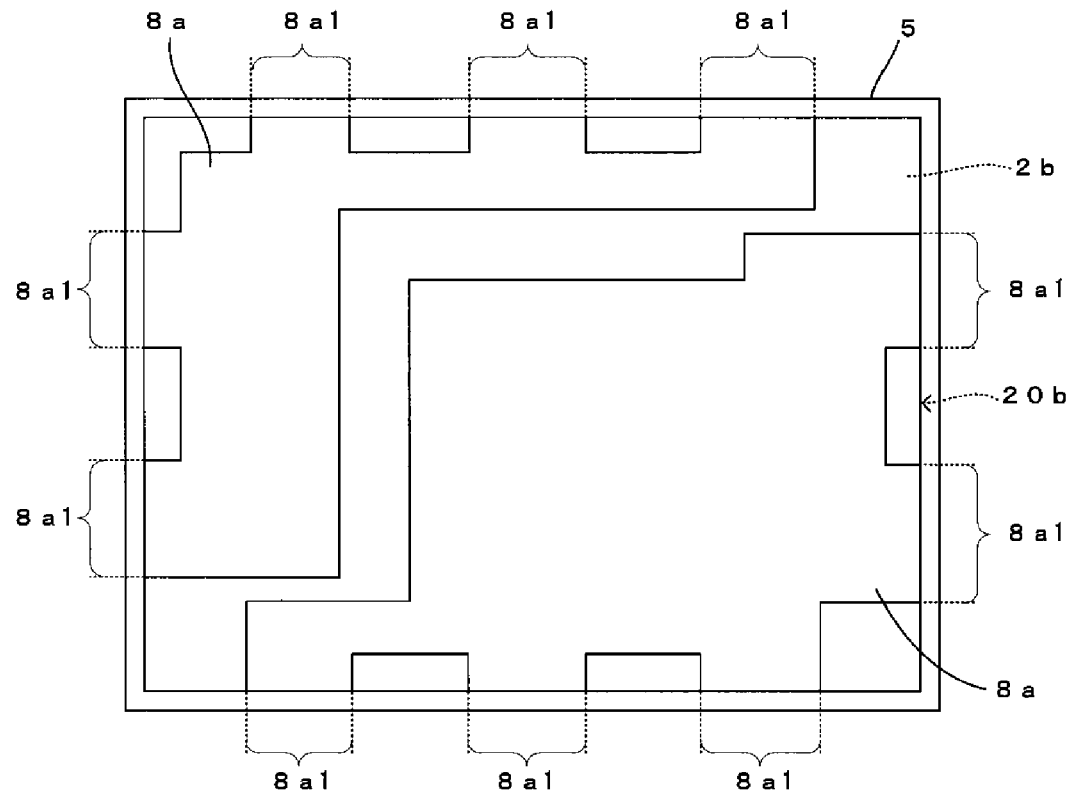
FIG. 8 is a diagram illustrating a ground electrode provided in a multilayer wiring substrate in FIG. 7.
Figure 9:
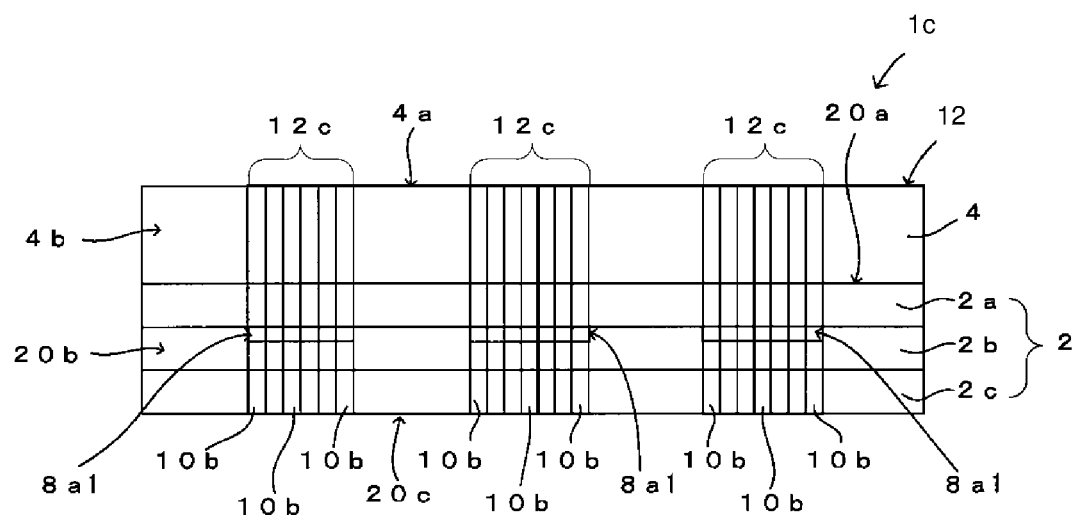
FIG. 9 is a side view of the high-frequency module in FIG. 8.

A high-frequency module according to a third embodiment of the present disclosure will be described while referring to FIGS. 7 to 9. FIG. 7 is a plan view of the high-frequency module, FIG. 8 is a diagram illustrating a ground electrode that is provided in a multilayer wiring substrate, and FIG. 9 is a side view of the high-frequency module. In this case, a top surface part of the shield film is not illustrated in FIG. 7. In addition, FIG. 8 illustrates a plan view of an inner wiring electrode (ground electrode). Furthermore, the shield film is not illustrated in FIG. 9.

A high-frequency module 1c according to this embodiment differs from the high-frequency module 1a of the first embodiment described while referring to FIGS. 1 to 3 in that the shape of the sealing body 12 in plan view is different, the arrangement configuration of the components 3 is different, the locations at which grooves 10b are formed are different, and the shape of the inner wiring electrode 8a is different, as illustrated in FIGS. 7 to 9. The rest of the configuration is the same as that of the high-frequency module 1a of the first embodiment and therefore the same symbols are used and description thereof is omitted.

In this case, each sealing body 12 is formed so as to have a rectangular shape in plan view. In addition, whereas an end portion of the inner wiring electrode 8a of the first embodiment is exposed along substantially the entire periphery of the side surface 20b of the multilayer wiring substrate 2, the inner wiring electrode 8a of this embodiment is patterned such that end portions thereof are exposed along only part of the side surface 20b of the multilayer wiring substrate 2, as illustrated in FIG. 8.

Furthermore, the assembly is divided into individual sealing bodies 12 using only laser processing. As illustrated in FIG. 9, regions 12c (corresponding to "prescribed region" of present disclosure), which contain exposed parts 8a1 of the end portions of the inner wiring electrode 8a, of the side surface of the sealing body 12 (side surfaces 4b and 20b of multilayer wiring substrate 2 and sealing resin layer 4) are roughened with a plurality of grooves 10b.

In the case where the sealing body 12 is formed (divided) by laser processing, the exposed parts 8a1 of the inner wiring electrode 8a at the side surface of the sealing body 12 are scorched and therefore adhesion of the shield film 5 in the regions 12c containing the exposed parts 8a1 is poor.

Accordingly, the adhesive strength of the shield film 5 can be improved by roughening the regions 12c.

(Modification of Grooves)

Figure 10:
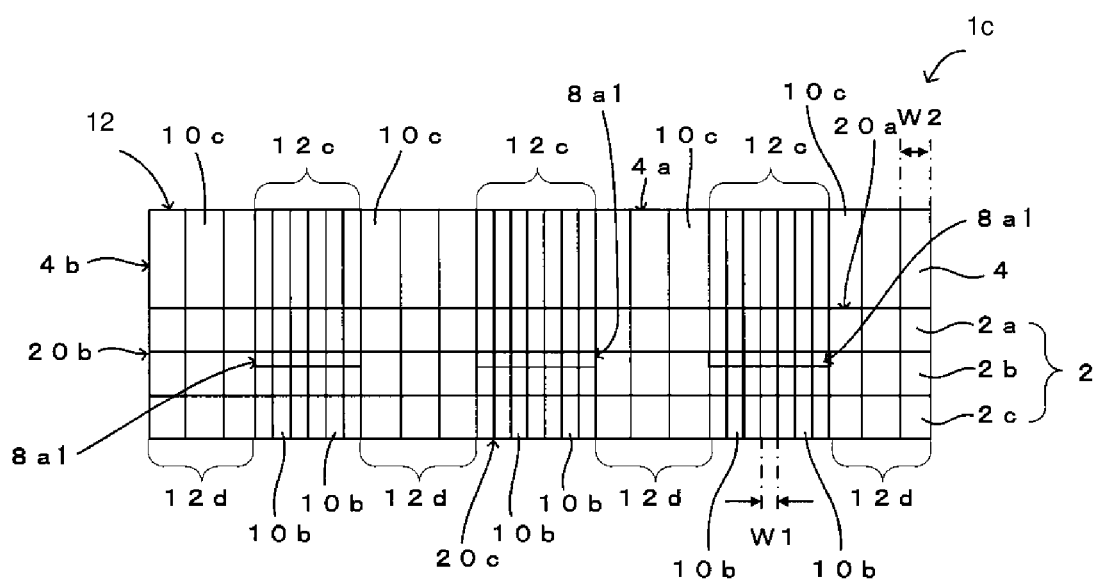
FIG. 10 is a diagram illustrating a modification of grooves provided in a side surface of a high-frequency module.

For example, as illustrated in FIG. 10, a plurality of grooves 10c may be provided in regions 12d (corresponding to "other region" of present disclosure) that are regions other than the regions 12c, which contain the exposed parts 8a1 of the inner wiring electrode 8a, of the side surface of the sealing body 12 in order to roughen these regions 12d. In this case, the grooves may be formed such that the number of grooves 10b per unit area in the regions 12c is greater than the number of grooves 10c per unit area in the other regions 12d by making a width W1 of each groove 10b provided in the regions 12c smaller than a width W2 of each groove 10c provided in the other regions 12d. With this configuration, the surface area of regions 12c where it has been difficult to attach the shield film 5 is increased, and therefore this configuration is effective for improving the adhesive strength of the entire shield film 5.

Fourth Embodiment

Figure 11:
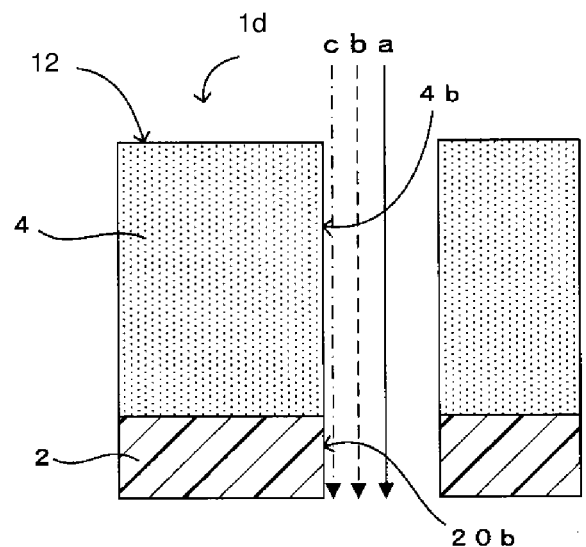
FIG. 11 is an explanatory diagram for a high-frequency module according to a fourth embodiment of the present disclosure.

A high-frequency module 1d according to a fourth embodiment of the present disclosure will be described while referring to FIGS. 11 and 12. FIGS. 11 and 12 are partial sectional views of the high-frequency module 1d, and illustrate only the multilayer wiring substrate 2 and the sealing resin layer 4, and do not illustrate the rest of the configuration of the high-frequency module 1d. In addition, FIG. 12A is a diagram illustrating sectional state obtained when the curved surface portions 12b are formed using a method according to this embodiment, and FIG. 12B is a diagram illustrating a sectional state obtained when the curved surface portions 12b are formed using a method of the related art.

The high-frequency module 1d according to this embodiment differs from the high-frequency module 1a of the first embodiment described while referring to FIGS. 1 to 3 in terms of the process used when performing laser processing, as illustrated in FIGS. 11 and 12. The rest of the configuration is the same as that of the high-frequency module 1a of the first embodiment and therefore the same symbols are used and description thereof is omitted.

In the high-frequency module 1a of the first embodiment, the curved surface portions 12b are formed on the side surface of the sealing body 12 (side surfaces 20b and 4b of multilayer wiring substrate 2 and sealing resin layer 4) using laser processing and the shield film 5 is then formed with the curved surface portions 12b in this state. However, comparatively high energy laser light is required to form the curved surface portions 12b. In this case, the cut surfaces (curved surface portions 12b) are thermally modified by the thermal energy generated when forming the curved surface portions 12b, and there is a risk that the peeling strength of the shield film 5 may be reduced. As a countermeasure to this, removal of the thermally modified layers of the cut surfaces using physical cleaning such as blasting after the laser processing may be considered. In this case, although recesses are formed when filler 40, which is contained inside the sealing resin layer 4, falls out at the side surface 4b of the sealing resin layer 4 (curved surface portions 12b), the flatness of the side surface 4b as a whole is improved by the physical cleaning (refer to FIG. 12B). In addition, in the case where the multilayer wiring substrate 2 is formed using a printed board (so-called P-board), glass fibers and the inner wiring electrode 8a that are exposed at the side surface 20b of the multilayer wiring substrate 2 (curved surface portions 12b) are planed away together with the resin, and the flatness is improved compared with before the physical cleaning. However, when the flatness of the curved surface portions 12b is improved, there is a disadvantage from the viewpoint of the adhesive strength of the shield film 5 in that an anchor effect is less likely to work.

Consequently, in this embodiment, laser processing is performed a plurality of times while changing the laser processing conditions. For example, as illustrated in FIG. 11, first laser processing is performed using laser light of an energy that is required to penetrate through the sealing body 12 in the thickness direction in order to form the curved surface portions 12b (refer to arrow a). Next, second laser processing is performed using laser light of a lower energy than was used in first laser processing (refer to arrow b). In this case, the laser light may be radiated at the same irradiation position as the laser light in the first laser processing, or the laser light may be radiated at position closer to the side surface of the sealing body 12 than in the first laser processing. Next, third laser processing is performed using laser light of a lower energy than was used in the second laser processing (refer to arrow c). In this case, the laser light may be radiated at the same irradiation position as the laser light in the first laser processing or second laser processing, or the laser light may be radiated at position closer to the side surface of the sealing body 12 than in the second laser processing.

In this way, the thermally modified layer generated by the second laser processing can be made thinner while removing the thermally modified layer of the cut surface (curved surface portions 12b) generated in the first laser processing by lowering the energy of the laser light used in the second laser processing from that used in the first laser processing. In addition, the thermally modified layer generated by the third laser processing can be made thinner than that generated by the second laser processing while removing the thermally modified layer of the cut surface (curved surface portions 12b) generated in the second laser processing by lowering the energy of the laser light used in the third laser processing from that used in the second laser processing. Therefore, the degree to which the adhesive strength of the shield film 5 is affected by the thermally modified layer can be reduced, and the peeling strength of the shield film 5 is improved. In addition, when laser processing is used, part of the filler 40 remains in the sealing resin layer 4 at the cut surface (curved surface portions 12b), and exposed parts of glass fibers and the inner wiring electrode 8a protrude from the cut surface (12b) of the multilayer wiring substrate 2 (refer to FIG. 12A). In this case, the surface roughness of the cut surface is increased, and therefore the peeling strength of the shield film 5 is further improved. In addition, an end portion of the inner wiring electrode 8a (ground electrode) protrudes from the cut surface, and consequently the connection between the shield film 5 and the inner wiring electrode 8a is improved, and therefore the shielding characteristic of the shield film 5 is improved. Ultrasonic cleaning may be performed after the final laser processing operation in order to remove the thin remaining thermally modified layer. Furthermore, the number of times laser processing is performed can be changed as appropriate within a range of a plurality of times.

Fifth Embodiment

A high-frequency module 1e according to a fifth embodiment of the present disclosure will be described while referring to FIGS. 13 and 14. FIG. 13 is a partial sectional view of the high-frequency module 1e of this embodiment and corresponds to FIG. 11. Furthermore, FIG. 14 is a diagram for explaining a manufacturing method of this embodiment, and is a plan view of an assembly of sealing bodies 12.

Figure 14:
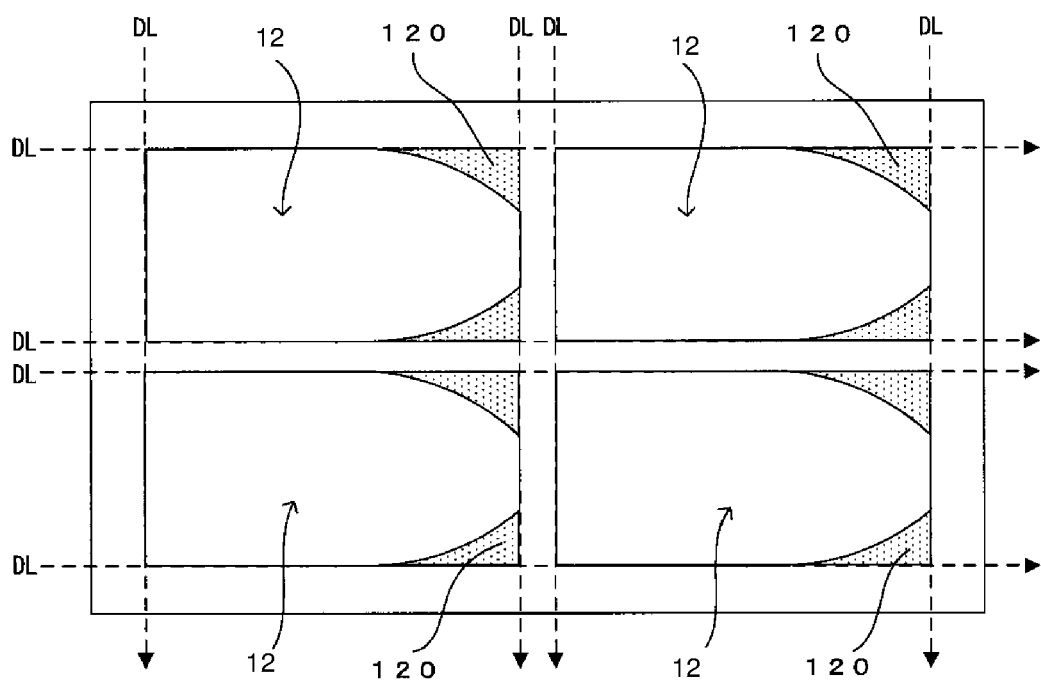
FIG. 14 is a diagram for explaining a sealing body dividing step.
Figure 15:
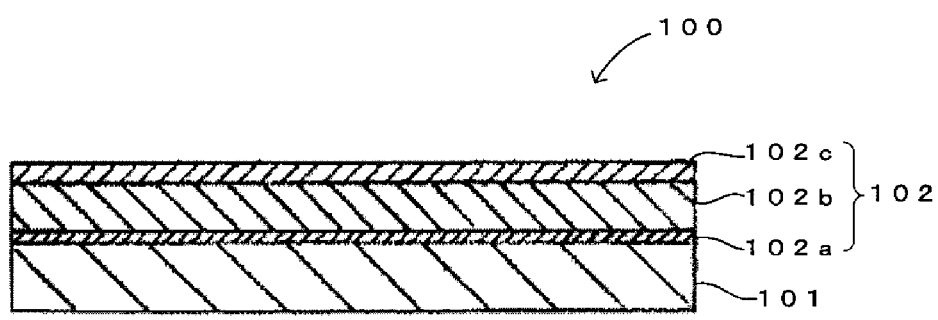
FIG. 15 is a sectional view of a high-frequency module of the related art.

The high-frequency module 1e of this embodiment differs from the high-frequency module 1a of the first embodiment described while referring to FIGS. 1 to 3 in terms of the laser processing step and the dicing machine cutting step of the manufacturing method thereof, as illustrated in FIGS. 13 and 14. The rest of the configuration is the same as that of the high-frequency module 1a of the first embodiment and therefore the same symbols are used and description thereof is omitted.

In this case, as illustrated in FIG. 14, an assembly of a plurality of sealing bodies 12 that is arrayed in a matrix pattern is formed, and then, first, the curved surface portions 12b are formed on the side surface of each sealing body 12 (side surfaces 20b and 4b of multilayer wiring substrate 2 and sealing resin layer 4) using laser processing, and then the assembly is cut into individual sealing bodies 12 using a dicing machine. In the laser processing, first, parts 120, which are cut away in the laser processing step in the first embodiment, (dot-shaded parts in FIG. 14: hereafter referred to as cut away parts 120) are hollowed out in first laser processing (refer to arrows a in FIG. 13) (first laser processing step). At this time, a plurality of grooves is formed in the curved surface portions 12b of each sealing body 12 and roughening of the curved surface portions 12b is thereby performed in the same manner as in the first embodiment. In this step, laser light of a comparatively high energy is radiated in order to penetrate through the sealing bodies 12 in the thickness direction, and therefore the cut surfaces (curved surface portions 12b) are thermally modified and there is a risk that the peeling strength of the shield film 5 may be reduced. Accordingly, similarly to as in the fourth embodiment, second laser processing is performed using laser light of a lower energy than in the first laser processing (refer to arrow b in FIG. 13: second laser processing step). Next, the assembly is cut into individual sealing bodies 12 by performing cutting with a dicing saw along dicing lines DL illustrated in FIG. 14 (dividing step), and after that the high-frequency module 1e is manufactured in the same manner as in the first embodiment. The order in which the laser processing step of forming the curved surface portions 12b of the sealing bodies 12 and the dicing step of cutting the assembly into individual sealing bodies 12 may be reversed.

Another method in which the assembly is cut into individual sealing bodies 12 using a dicing saw after performing laser processing will be described. First, through grooves are dug using laser light in only in the locations of the curved surface portions 12b of the sealing bodies 12 out of the cut away parts 120, and then the thermally modified layer generated by the first laser processing is removed by radiating second laser light onto the through grooves similarly to as in the fourth embodiment. A method can be considered in which the assembly is then divided into individual sealing bodies by cutting along the dicing lines DL in FIG. 14 with a dicing saw. In this case, if the width of the through grooves formed in the first laser processing is small, cutting waste generated during the second laser processing may become attached to the curved surface portions 12b of the side surface of the sealing bodies 12, and there is a risk of the adhesive strength of the shield film 5 being reduced in such a case. Therefore, when this kind of method is adopted, a step of removing cutting waste that has become adhered to the curved surface portions 12b of the sealing bodies 12 using ultrasonic cleaning or the like is needed after the laser processing step or the dicing step has finished.

Therefore, when the cut away parts 120 are hollowed out during the first laser processing as in this embodiment, cutting waste generated during second laser processing is unlikely to adhere to the curved surface portions 12b of the sealing bodies, and therefore a subsequent ultrasonic cleaning step is unnecessary and there is no need to take into consideration damage caused to the product by ultrasonic cleaning. In addition, since the cut away portions 120 are hollowed out prior to the dicing step, the cut away portions 120 are not generated as cut pieces in the dicing step. Therefore, the products produced by cutting the assembly into individual sealing bodies 12 are easier to handle, and problems caused by the infiltration of cut pieces can be prevented. In addition, visual inspection of the curved surface portions 12b of the sealing bodies 12 obtained after the laser processing step can be easily performed. Third or more laser processing may be performed in order to make the thermally modified layer thinner, similarly to as in the fourth embodiment.

In addition, in the manufacturing method in which through grooves are dug using a laser at just the locations of the curved surface portions 12b of the sealing bodies 12 during the first laser processing, if the width of the through grooves formed during the first laser processing is increased to such a degree that cutting waste generated during the second laser processing will not adhere, cutting waste generated during the second laser processing can be prevented from adhering to the curved surface portions 12b of the side surfaces of the sealing bodies 12 as in the manufacturing method of this embodiment.

The present disclosure is not limited to the above-described embodiments and can be modified in various ways not described above so long as the modifications do not depart from the gist of the disclosure. For example, the configurations of the embodiments and modifications described above may be combined with each other.

Furthermore, the sealing resin layers 4 and 40 may be additionally provided with a shield wall that prevents noise interference between the components 3 and 30.

In addition, in the above-described embodiments, a case has been described in which the shield film 5 is formed using a sputtering method or a vacuum deposition method, but the shield film 5 may instead be formed by depositing a conductive paste on the surface of the sealing body 12 using a spin coater, for example.

Furthermore, the number of insulating layers constituting the multilayer wiring substrate 2 can be changed, as appropriate.

INDUSTRIAL APPLICABILITY

The present disclosure can be applied to a variety of high-frequency modules that include a sealing resin layer that covers a plurality of components mounted on a wiring substrate, and a shield film that shields the components from unwanted external electromagnetic waves.

REFERENCE SIGNS LIST 1a to 1e high-frequency module
2 multilayer wiring substrate (wiring substrate)
20a upper surface (main surface)
3, 30 component
4, 40 sealing resin layer
5 shield film
8a inner wiring electrode (ground electrode)
8a1 end portion
10a to 10c groove
12 sealing body
12b curved surface portion
12c region (prescribed region)
12d region (other regions)

The invention claimed is:

1. A high-frequency module comprising:
a sealing body that includes a wiring substrate, a component that is mounted on a main surface of the wiring substrate, and a sealing resin layer that is stacked on the main surface of the wiring substrate and that covers the component; and
a shield film that covers a surface of the sealing resin layer;
wherein a side surface of the sealing body has a curved surface portion that is in a curved surface or a substantially curved surface,
the curved surface portion is roughened, and
the side surface extends in a downward direction relative to an upper surface of the sealing body toward a surface of the wiring substrate that is opposite the main surface of the wiring substrate,
wherein a plurality of grooves that extends in a direction that intersects the main surface of the wiring substrate is provided in the curved surface portion, and the curved surface portion is roughened with the plurality of grooves.

2. The high-frequency module according to claim 1, further comprising:
a ground electrode that is provided in or on the wiring substrate;
wherein an end portion of the ground electrode is exposed at the curved surface portion.

3. The high-frequency module according to claim 2, wherein the end portion of the ground electrode protrudes from the curved surface of the curved surface portion.

4. A high-frequency module comprising:
a sealing body that includes a wiring substrate that is provided with a ground electrode, a component that is mounted on a main surface of the wiring substrate, and a sealing resin layer that is stacked on the main surface of the wiring substrate and that covers the component; and
a shield film that covers a surface of the sealing resin layer;
wherein an exposed part of an end portion of the ground electrode is formed at a side surface of the sealing body, and
a prescribed region of the side surface of the sealing body, the prescribed region containing the exposed part of the end portion of the ground electrode, and the prescribed region being roughened, and
wherein a plurality of grooves that extends in a direction that intersects the main surface of the wiring substrate is provided in a curved surface portion of the side surface, and the curved surface portion is roughened with the plurality of grooves.

5. The high-frequency module according to claim 4, wherein a plurality of second grooves that extends in a direction that intersects the main surface of the wiring substrate is provided in the prescribed region, and the prescribed region is roughened with the plurality of second grooves.

6. The high-frequency module according to claim 5,
wherein the curved surface portion is different from the prescribed region, and
the plurality of second grooves provided in the prescribed region have a smaller width than the plurality of grooves provided in the curved surface portion of the side surface, and the prescribed region has a larger number of grooves per unit area than the curved surface portion of the side surface.

7. A high-frequency module manufacturing method comprising:
- a preparation step of preparing an assembly in which a plurality of sealing bodies is arrayed in a matrix pattern, each sealing body including a wiring substrate, a component that is mounted on a main surface of the wiring substrate, and a sealing resin layer that is stacked on the main surface of the wiring substrate and covers the component;
- a first laser processing step of forming a curved surface portion on part of a side surface of each sealing body by hollowing out part of the assembly using laser processing;
- a second laser processing step of irradiating the curved surface portions of the sealing bodies with laser light of a lower energy than laser light used in the first laser processing step;
- a dividing step of dividing the assembly into individual sealing bodies by cutting the assembly with a dicing machine or with laser processing; and
- a shield film forming step of forming shield films that cover surfaces of the sealing resin layers of the sealing bodies;
- wherein in the first laser processing step, the curved surface portions of the sealing bodies are roughened by being scanned with laser light.

8. The high-frequency module manufacturing method according to claim 7 further comprising a third laser processing step of irradiating the curved surface portions of the sealing bodies with laser light of a lower energy than laser light used in the second laser processing step.

* * * * *